(12) United States Patent
Kourkoulos et al.

(10) Patent No.: US 10,796,046 B2
(45) Date of Patent: Oct. 6, 2020

(54) MACHINE LEARNING-BASED PARASITIC EXTRACTION AUTOMATION FOR CIRCUIT DESIGN AND VERIFICATION

(71) Applicant: Mentor Graphics Corporation, Wilsonville, OR (US)

(72) Inventors: Vasileios Kourkoulos, Portland, OR (US); Rengjing Zhang, Portland, OR (US); Joshua Adkins, Salem, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/549,929

(22) Filed: Aug. 23, 2019

(65) Prior Publication Data

US 2020/0233931 A1    Jul. 23, 2020

Related U.S. Application Data

(60) Provisional application No. 62/794,067, filed on Jan. 18, 2019.

(51) Int. Cl.
*G06F 30/00* (2020.01)
*G06F 30/327* (2020.01)
*G06N 20/00* (2019.01)

(52) U.S. Cl.
CPC ........... *G06F 30/327* (2020.01); *G06N 20/00* (2019.01)

(58) Field of Classification Search
CPC .............................. G06F 30/327; G06N 20/00
USPC ....................................................... 716/101
See application file for complete search history.

(56) References Cited

U.S. PATENT DOCUMENTS

| 9,223,912 | B1* | 12/2015 | Liapis | G06F 30/367 |
| 2005/0198605 | A1* | 9/2005 | Knol | G06F 30/392 |
| | | | | 716/124 |
| 2006/0111884 | A1* | 5/2006 | McGaughy | G06F 30/367 |
| | | | | 703/14 |
| 2009/0031268 | A1* | 1/2009 | Miranda | G06F 30/3312 |
| | | | | 716/113 |
| 2014/0282308 | A1* | 9/2014 | Chen | G06F 30/30 |
| | | | | 716/102 |
| 2015/0007124 | A1* | 1/2015 | Krasnicki | G06F 30/30 |
| | | | | 716/136 |

(Continued)

*Primary Examiner* — Suchin Parihar
(74) *Attorney, Agent, or Firm* — Mentor Graphics Corporation

(57) ABSTRACT

This application discloses a computing system implementing a parasitic extraction tool to generate parasitic netlists from tests cases including test layout models of integrated circuit structures. The test cases include reference netlists corresponding to intended parasitic netlists for the test layout models. The computing system can determine values for scaling coefficients that, when utilized by the parasitic extraction tool to generate the parasitic netlists, allow differences between the parasitic netlists and the reference netlists to fall below threshold levels. The determination of the scaling coefficients is performed by iteratively adjusting the values of the scaling coefficients based on differences between the reference netlists and the parasitic netlists generated with the scaling coefficients having the adjusted values. The computing system can utilize the adjusted scaling coefficients to generate parasitic netlists having differences with the reference netlists that fall below threshold levels of the test cases.

20 Claims, 7 Drawing Sheets

(56) References Cited

U.S. PATENT DOCUMENTS

2015/0302128 A1\* 10/2015 Katta .................... G06F 30/392
716/120

\* cited by examiner

CONDUCTOR CROSS-SECTION

REPRESENTATION OF THE CONDUCTOR CROSS-SECTION
FOR PARASITIC EXTRACTION

SIMPLIFIED REPRESENTATION OF THE CONDUCTOR
CROSS-SECTION FOR PARASITIC EXTRACTION

MACHINE LEARNING-BASED PARASITIC EXTRACTION AUTOMATION FOR CIRCUIT DESIGN AND VERIFICATION

RELATED APPLICATION

This patent application claims priority to U.S. Provisional Patent Application No. 62/794,067, filed Jan. 18, 2019, which is incorporated by reference herein.

TECHNICAL FIELD

This application is generally related to electronic design automation and, more specifically, to machine learning-based parasitic extraction automation for circuit design and verification.

BACKGROUND

In a design flow for fabricating integrated circuits, a physical design of an integrated circuit can describe specific geometric elements, often referred to as a "layout" design. The geometric elements, which typically are polygons, define the shapes that will be created in various materials to manufacture the integrated circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Typically, a designer will perform a number of analyses on the resulting layout design of the integrated circuit. For example, the layout design may be analyzed to confirm that it accurately represents the circuit devices and their relationships as described in a logical design of the integrated circuit. The layout design also may be analyzed to confirm that it complies with various design requirements, such as minimum spacing between the geometric elements. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes, that modify the layout design data to improve the usable resolution of the reticle or mask created from the design in a photolithographic manufacturing process.

During the physical design analysis, the layout design may be analyzed to determine parasitic values, such as resistances, capacitances, inductances, or the like, of nets in the layout design, which can be utilized to determine whether the layout design includes voltage drops, signal delay, or signal noise. Most circuit designers utilize a parasitic extraction tool to extract these parasitic values from the layout design, for example, extracting nets from the layout design, determining parasitic electrical models from the extracted nets, and writing the parasitic electrical models to a netlist. For typical layout designs, most of the parasitic electrical models include an electrical representation of one extracted net, as each net is typically intended to be electrically-independent from other nets in the layout design. However, since most layout designs include nets that experience an unintended exchange of electromagnetic fields—often called noise or cross-talk—some of the parasitic electrical models include electrical representations of multiple different nets coupled with a capacitance representing the noise or cross-talk between the nets.

Foundries that manufacture integrated circuits can generate rules, often called a rule deck, to guide operation of the parasitic extraction tools. These foundries can work with the manufacturers of the parasitic extraction tools to generate the rules and certify the parasitic extraction tools operate within a margin of error set by the foundry. For example, foundries can provide manufacturers of parasitic extraction tools with test specifications of various layout geometries along with reference parasitic models for the test specifications. The manufacturers of parasitic extraction tools can generate layout models based on the test specifications, perform parasitic extraction on the layout models, and then compare the resultant parasitic models to the reference parasitic models from the foundry. When the differences between the resultant parasitic models and the reference parasitic models fall within the margin of error, the foundry can certify the parasitic extraction tool. The foundries often provide several thousand different test specifications, rendering it a difficult, often iterative, and time-consuming task for the manufacturers of parasitic extraction tools to generate layout models and properly configure the parasitic extraction tool to meet the tight error requirements for foundry certification.

SUMMARY

This application discloses a computing system implementing a parasitic extraction tool to generate parasitic netlists from tests cases including test layout models of integrated circuit structures. The test cases include reference netlists corresponding to intended parasitic netlists for the test layout models. The computing system can determine values for scaling coefficients that, when utilized by the parasitic extraction tool to generate the parasitic netlists, allow differences between the parasitic netlists and the reference netlists to fall below threshold levels. The determination of the scaling coefficients is performed by iteratively adjusting the values of the scaling coefficients based on differences between the reference netlists and the parasitic netlists generated with the scaling coefficients having the adjusted values. The computing system can utilize the adjusted scaling coefficients to generate parasitic netlists having differences with the reference netlists that fall below threshold levels of the test cases. Embodiments will be described below in greater detail.

DETAILED DESCRIPTION

Figure 1:
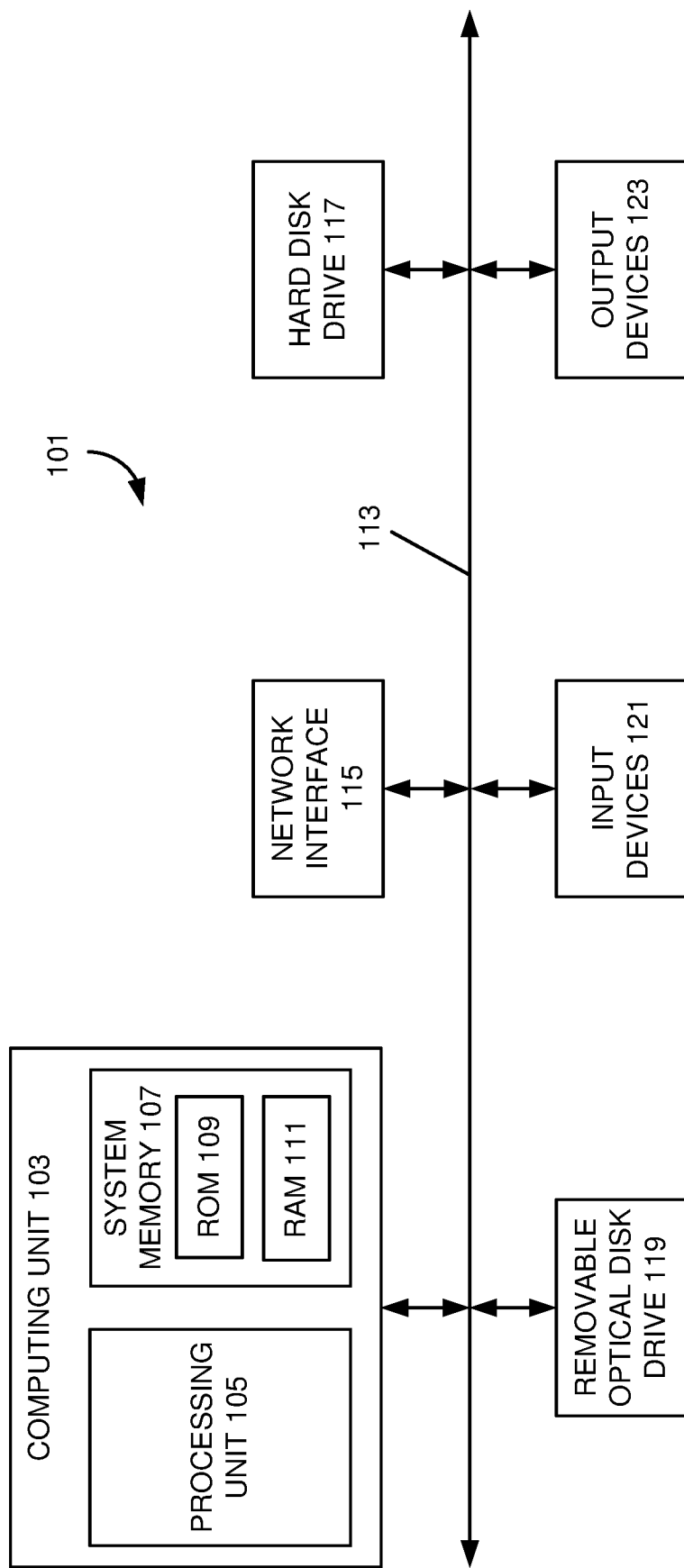
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 115-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
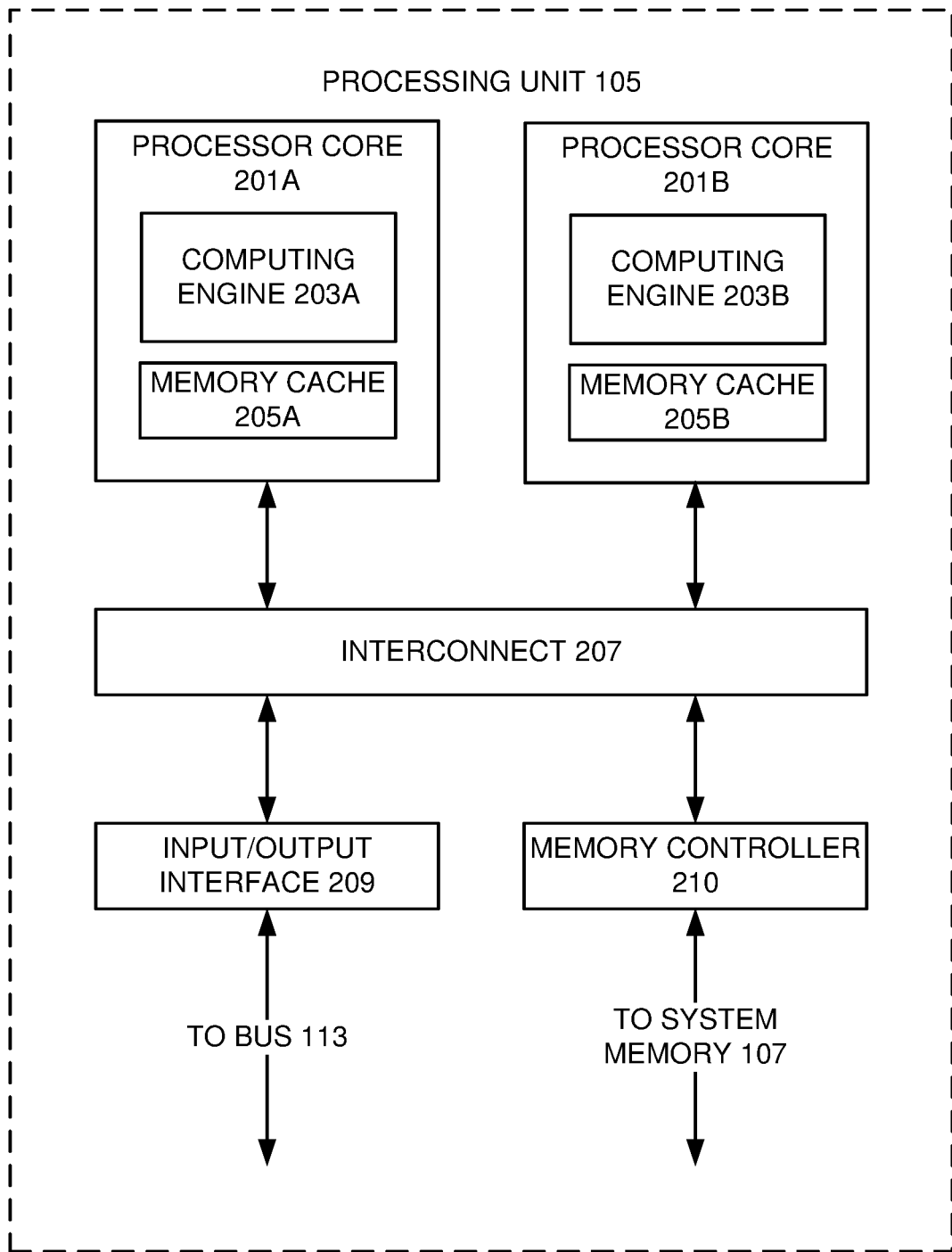

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Machine Learning-Based Parasitic Extraction Automation

Figure 3:
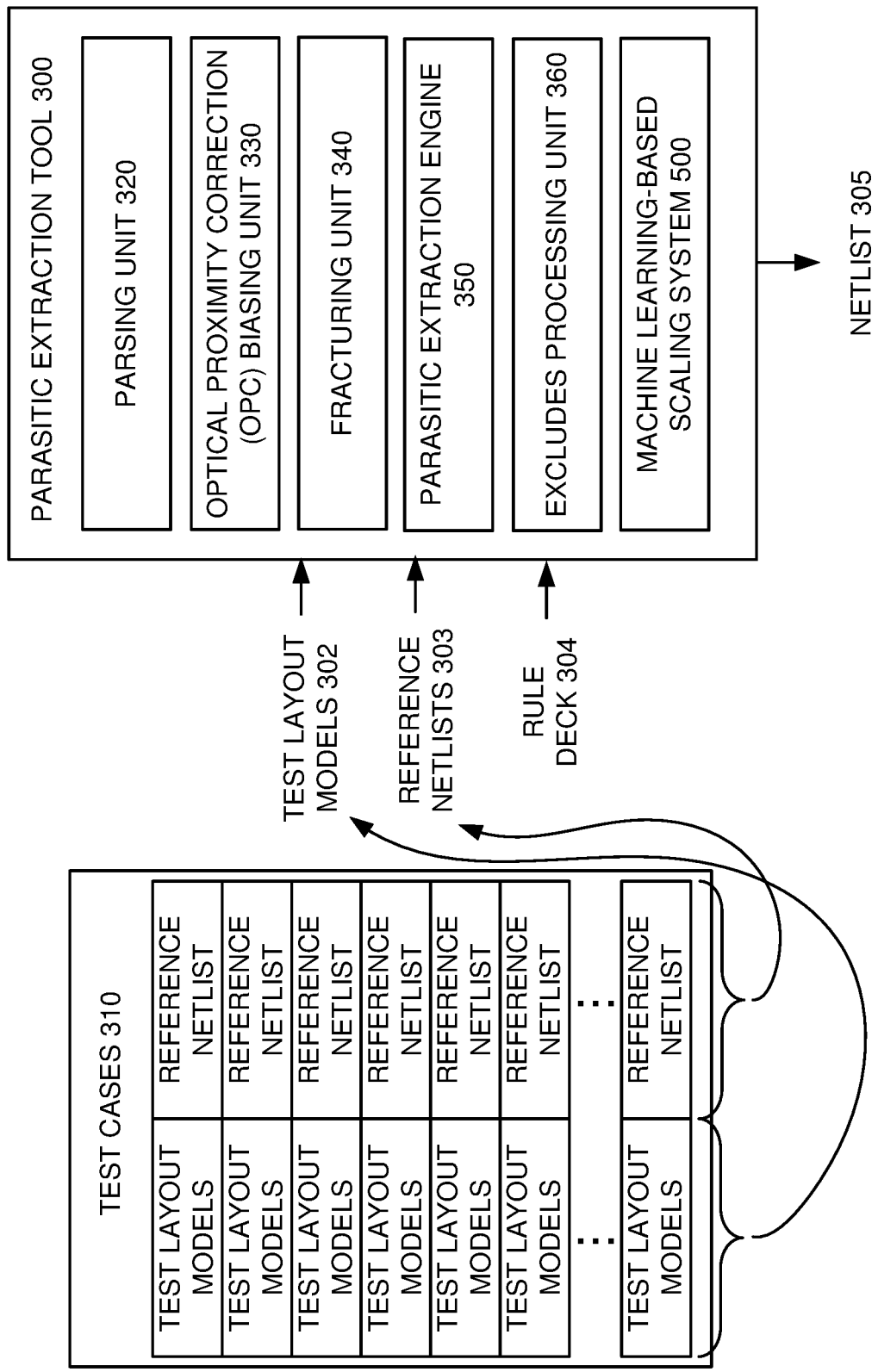
FIG. 3 illustrates an example of a parasitic extraction tool implementing automated capacitance scaling according to various embodiments.

FIG. 3 illustrates an example of a parasitic extraction tool 300 implementing automated capacitance scaling according to various embodiments. Referring to FIG. 3, the parasitic extraction tool 300 can receive a physical design layout, for example, to describe an electronic device in terms of planar geometric shapes corresponding to patterns of metal, oxide, or semiconductor layers that make up components of the electronic device. In some embodiments, the physical design layout can describe or model the electronic device in a Library Exchange Format (LEF), a Design Exchange Format (DEF), or the like.

The parasitic extraction tool 300 can receive a rule deck 304 developed by a foundry that describes design rules for geometric configurations of physical integrated circuit design data. The parasitic extraction tool 300 can utilize the design rules in the rule deck 304 to perform parasitic extraction on the physical design layout, for example, by converting the physical design layout into an electrical representation, such as a group of electrically-independent parasitic models, and generate a netlist 305 including the electrical representation of the physical design layout. In some embodiments, the netlist 305 can describe or model the electronic device in a Standard Parasitic Exchange Format (SPEF), or the like.

The parasitic extraction tool 300 can include a parsing unit 320 to parse the physical design layout based, at least in part, on the design rules in the rule deck 304. The parasitic extraction tool 300 can include an optical proximity correction (OPC) biasing unit 330 to alter the structure of the physical design layout, for example, edges in the physical layout design may be adjusted to make certain portions of the geometric elements larger or smaller, in accordance with how much additional light exposure (or lack of exposure) may be desired at certain points on the substrate.

The parasitic extraction tool 300 can include a fracturing unit 340 to select portions of the physical layout design to represent with electrical parasitic elements based, at least in part, on the rule deck 304. For example, a conductive trace represented in the physical layout design can be fractured into multiple portions, each to be represented by a different resistive element and at least one conductive element. The fracturing unit 340 can determine how to divide the physical layout design for the parasitic extraction process.

The parasitic extraction tool 300 can include a parasitic extraction engine 350 to extract nets from the physical design layout and identify parasitic values in each extract net based on how the net was divided by the fracturing unit 340. The parasitic extraction engine 350 can generate an electrical representation of each extracted net based on the parasitic values. The parasitic values can include resistances in the nets, capacitances between the net and a ground plane having a corresponding ground voltage, coupling capacitances between proximate nets, inductances, or the like. In some embodiments, the coupling capacitance in the electrical representation can model noise or cross-talk in the net due to exchange of electromagnetic fields between multiple nets.

The parasitic extraction tool 300 can include an excludes processing unit 360 to identify portions of the physical layout design to exclude from the parasitic extraction process. For example, a foundry may manufacture an electrical component, such as a transistor, without providing detail on its physical layout design, so the excludes processing unit 360 remove the internal structure of the electrical component from the parasitic extraction process performed by the parasitic extraction engine 350. An example of parasitic extraction will be described below with reference to FIG. 4.

Figure 4:
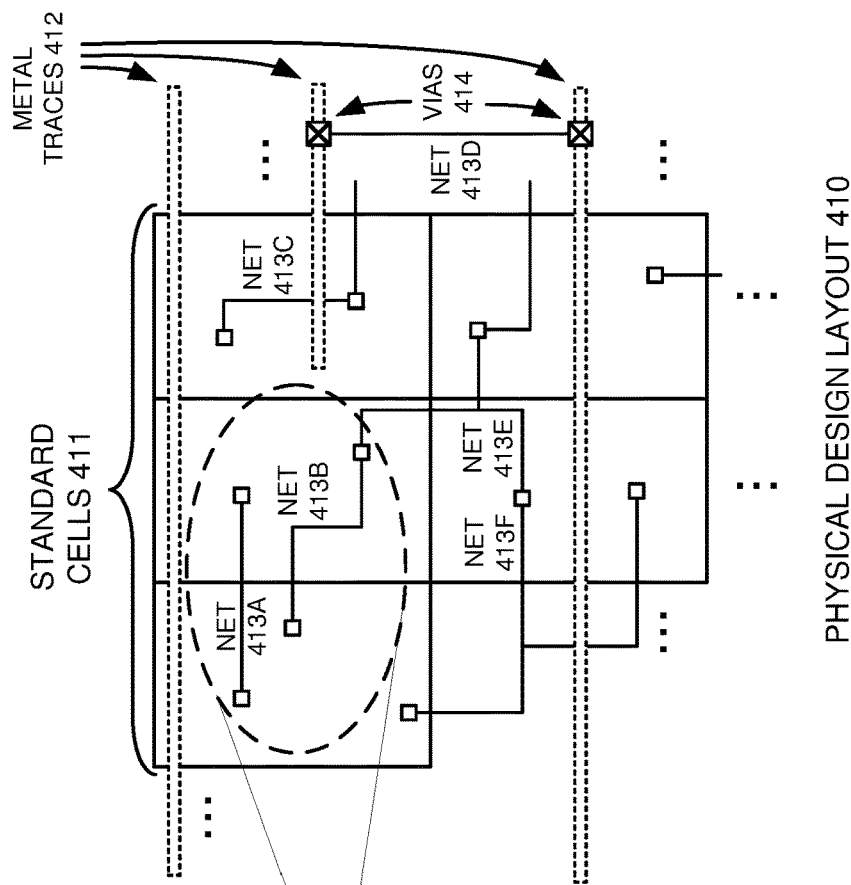
FIG. 4 illustrates an example implementation of parasitic extraction according to various embodiments.
Figure 4:
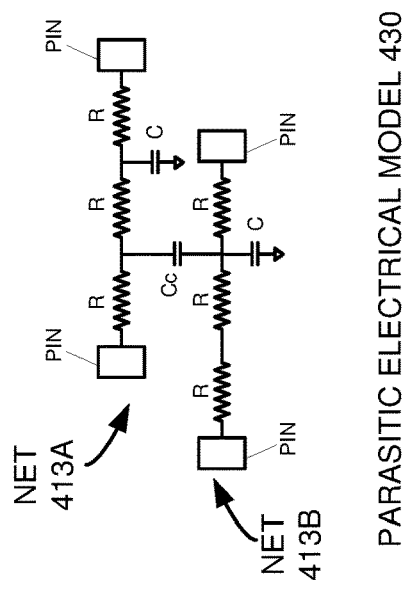

FIG. 4 illustrates an example implementation of parasitic extraction according to various embodiments of the invention. Referring to FIG. 4, a physical design layout 410 can describe an electronic device in terms of planar geometric shapes corresponding to patterns of metal, oxide, or semiconductor layers that make up components of the electronic device. In some embodiments, the physical design layout 410 can describe or model the electronic device in a Library Exchange Format (LEF), a Design Exchange Format (DEF), or the like.

The physical design layout 410 can include an array of standard cells 411, each including circuitry, such as a group of one or more transistors and interconnect structures to provide, for example, Boolean logic, storage, or the like, and at least one pins coupled to the circuitry. The physical design layout 410 can include nets 413A-413F to describe wires or electrical paths between pins in the physical design layout 410, for example, to interconnect circuitry in the standard cells 411. The physical design layout 410 also can include additional metal layers, such as metal traces 412, and vias 414 to interconnect different layers of the physical design layout 410.

During parasitic extraction, a parasitic extraction tool can extract nets from the physical design layout 410 and convert the nets 413 into one or more corresponding electrical representations. For simplicity, FIG. 4 shows the parasitic extraction of nets 413A and 413B and their conversion into a parasitic electrical model 430. The parasitic electrical model 430 can include an electrical representation of net 413A coupled to an electrical representation of net 413B with coupling capacitors $C_C$.

Referring back to FIG. 3, the parasitic extraction tool 300 can be tested, for example, with test cases 310. For example, a foundry typically has a certification process for electronic design tools, such the parasitic extraction tool 300, to ensure compatibility between the operation of electronic design tools and integrated circuit manufacturing performed by the foundry. For parasitic extraction, the foundry can generate a foundry certification test, for example, having test cases 310, that, when passed by the parasitic extraction tool 300, can allow the foundry to certify the parasitic extraction tool 300 complies with the manufacturing process of the foundry. In other examples, the parasitic extraction tool 300 can be tested with test cases 310 to gauge the accuracy of the parasitic extraction tool 300, such as with a higher accuracy test, or for the determination of accuracy of parasitic extraction for a specific structure, such as in a trapezoidal accuracy test, which will be describe below in greater detail.

The test cases 310 can each include a test layout model 302 and corresponding reference netlist 303. Each of the test layout models 302 can include a layout design of physical structures for fabrication and potentially a written description of the physical structures to undergo parasitic extraction. The reference netlists 302 can include netlists describing parasitic electrical models associated with their corresponding test layout model 302. In some embodiments, the reference netlists 303 can describe or model an electronic device in a Standard Parasitic Exchange Format (SPEF), or the like.

In some example embodiments, in order to pass the test cases 310, the manufacturer of the parasitic extraction tool generates physical structures from the layout designs in test layout models 302 and written descriptions of the physical structures in test layout models 302, performs parasitic extraction on the physical structures to generate the netlists 305, and compares the netlists 305 to the reference netlists 303. When the differences between the netlists 305 and the reference netlists 303 fall below a preset threshold of allowable error for each of the test cases, the parasitic extraction tool can be deemed to have passed the test cases 310.

The parasitic extraction tool 300 can receive the test layout models 302 describing layout design in terms of planar geometric shapes corresponding to patterns of metal, oxide, or semiconductor layers that make up components of the electronic device. In some embodiments, the layout design in the test layout models 302 can describe or model an electronic device in a Library Exchange Format (LEF), a Design Exchange Format (DEF), or the like.

The parasitic extraction tool 300 can receive reference netlists 303, for example, from the test cases 310. Each of the reference netlists 303 can correspond to one or more electrical parasitic models for the corresponding test layout models 302. In some embodiments, the reference netlists 303 can describe or model the electronic device in a Standard Parasitic Exchange Format (SPEF), or the like.

The parasitic extraction tool 300 can convert the layout design in the test layout models 302 into physical structures based on the written description of the physical structures in the test layout models 302, perform parasitic extraction on the physical structures based, at least in part, on the rule deck 304 to generate the netlists 305.

The parasitic extraction tool 300 can include a machine learning-based scaling system 500 to determine differences or errors between the netlists 305 and the reference netlists 303 for each of the test cases. The machine learning-based scaling system 500 can reduce the differences or errors by scaling the capacitances in the netlists 305 generated from the physical structures with scaling coefficients. In some embodiments, the machine learning-based scaling system 500 can iteratively adjust the scaling coefficients based on the determined errors, for example, setting values of the scaling coefficients, scaling the capacitances in the netlists 305 with the scaling coefficients, determining errors between the netlists 305 having the scaled capacitances and the reference netlists 303, and then adjusting the values of the scaling coefficients based on the determined errors. By adjusting the scaling coefficients based on the errors between the netlists 305 having the scaled capacitances and the reference netlists 303, the machine learning-based scaling system 500 can identify a set of scaling coefficients that can generate netlists 305 having differences with the reference netlists 303 that fall below a threshold level of allowable error. Embodiments of the machine learning-based scaling of parasitic capacitances will be described below in greater detail.

Figure 5:
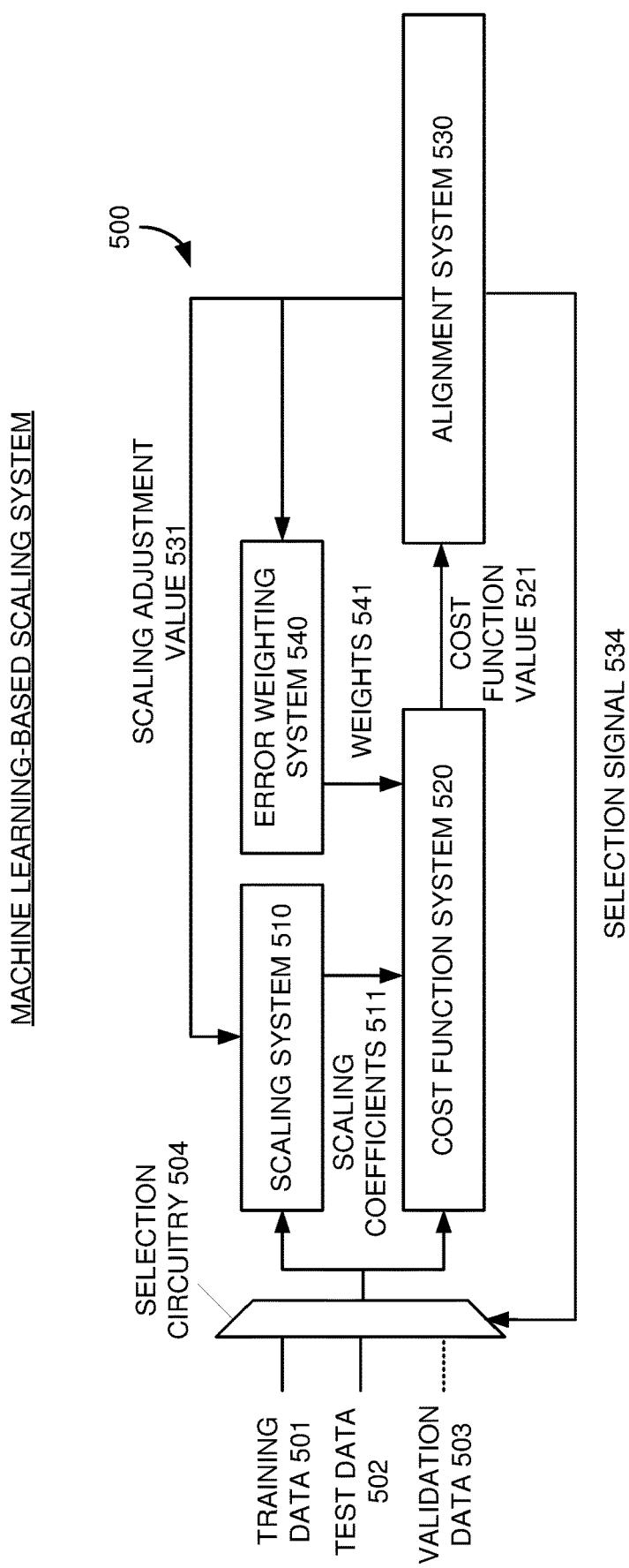
FIG. 5 illustrates an example scaling system implemented with machine-learning in a parasitic extraction tool according to various examples.
Figure 6:
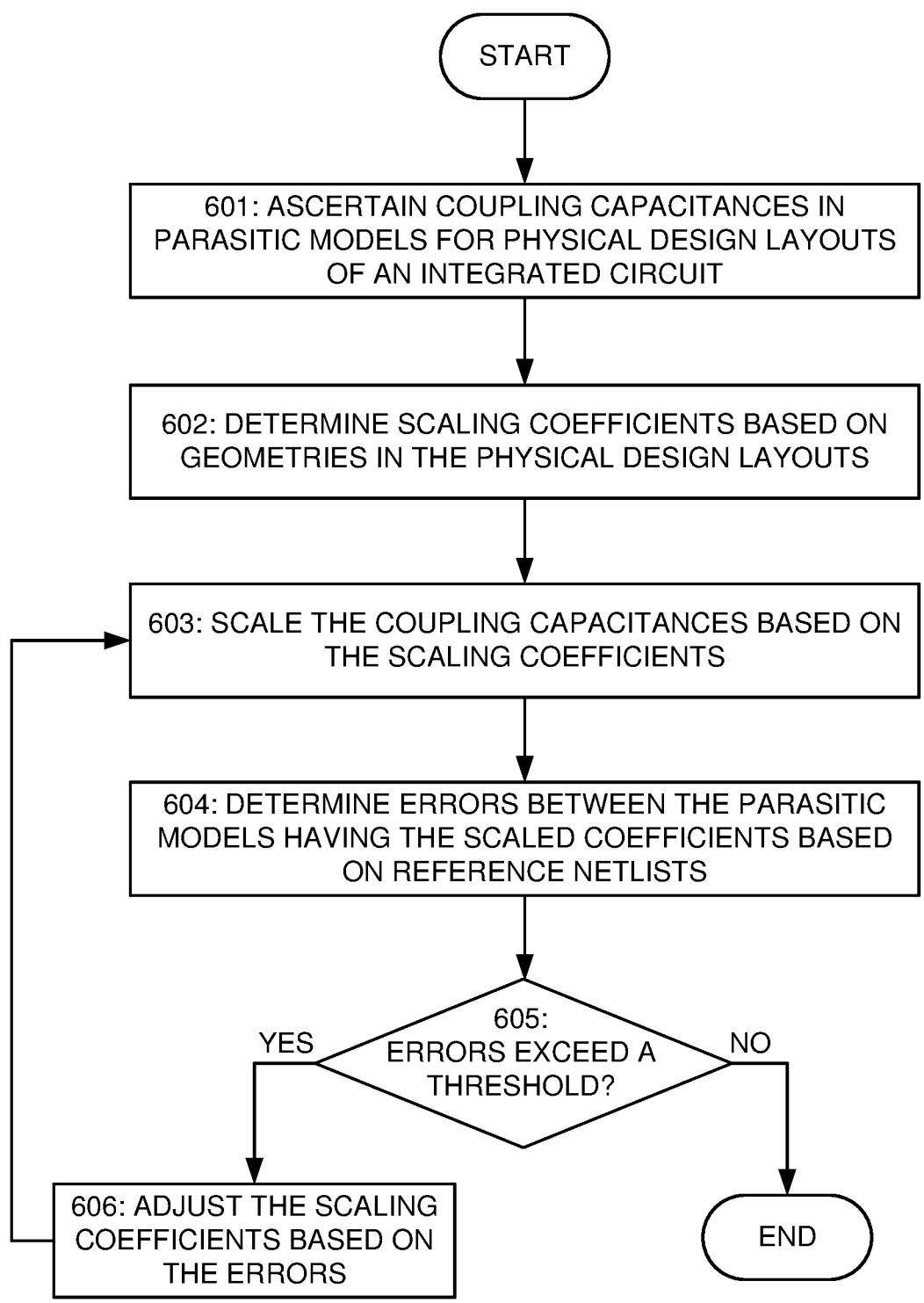
FIG. 6 illustrates a flowchart showing example machine-learning scaling in a parasitic extraction tool according to various examples.

FIG. 5 illustrates an example scaling system implemented with machine-learning in a parasitic extraction tool according to various examples. FIG. 6 illustrates a flowchart showing example machine-learning scaling in a parasitic extraction tool according to various examples. Referring to FIGS. 5 and 6, a machine learning-based scaling system 500 can include a scaling system 510 to receive one or more physical design layouts of an integrated circuit and parasitic models extracted from the physical design layouts, for example, by a parasitic extraction engine. The physical design layouts can describe the layers of the geometries, minimum distances between the geometries, information corresponding to the nets associated with the geometries, or the like. In some embodiments, the scaling system 510 can receive the physical design layouts and corresponding parasitic models via selection circuitry 504, which can output training data 501, test data 502, and/or validation data 503 based on a selection signal 534. The training data 501, the test data 502, and the validation data 503 each can include the physical design layouts and corresponding parasitic models.

In a block 601, the scaling system 510 can ascertain coupling capacitances in the parasitic models for the physical design layouts of the integrated circuit and, in a block 602, the scaling system 510 can determine scaling coefficients 511 based on geometries in the physical design layouts. In some embodiments, the scaling system 510 can generate a feature vector based on the geometries in the physical design layouts and then generate the scaling coefficients 511 from the feature vector. For example, when the feature vector includes an average thickness between two geometries, the scaling system 510 can retrieve the thicknesses of the two geometries from the physical design layouts and derive the average of the thicknesses for inclusion in the feature vector. In some embodiments, the feature vector may include a distance between the geometries, which the scaling system 510 can ascertain from the physical design layouts. In a block 603, the scaling system 510 can scale the coupling capacitances based on the scaling coefficients 511 and then utilize the scaled coupling capacitances with the physical design layouts to generate actual results for the parasitic models.

The machine learning-based scaling system 500 can include a cost function system 520 to receive the scaling coefficients 511 from the scaling system 510 and receive the physical design layouts and corresponding parasitic models from the selection circuitry 504. The cost function system 520 also can receive reference models via the selection circuitry 504. The reference models can describe electrical parasitic models of a test specification that described the physical design layouts, for example, generated by a foundry.

In a block 604, the cost function system 520 can compare the actual results for the parasitic models against the reference models to determine errors between them for each of the coupling capacitances. The cost function system 520 can generate a cost function value 521 based on the errors between the actual results for the parasitic models against the reference models. In some embodiments, the cost function value 521 can be an absolute value of an accumulation of the errors between the actual results for the parasitic models against the reference models.

The machine learning-based scaling system 500 can include an alignment system 530 to receive the cost function value 521 from the cost function system 520. In a decision block 605, the alignment system 530 can utilize the cost function value 521 to determine whether each of the errors between the actual results for the parasitic models against the reference models exceed a threshold level of allowable error. When the alignment system 530 determines that the errors for each of the coupling capacitances fall below the preset threshold value, the alignment system 530 can indicate that the scaling coefficients 511 utilized to scale the coupling capacitances allowed the parasitic extraction tool to generate parasitic models that satisfied a set of test cases.

When the alignment system 530 determines that any of errors for the coupling capacitances exceed the preset threshold value, the alignment system 530, in a block 606, can determine an adjustment for the scaling coefficients 511 based on the errors and generate a scaling adjustment value 531. The alignment system 530 can provide the scaling adjustment value 531 to the scaling system 510 for subsequent generation of the scaling coefficients 511.

The machine learning-based scaling system 500 can include an error weighting system 540 to set weights 541 for each of the errors associated with coupling capacitances in the determination of the cost function value 521. The alignment system 530 can provide the scaling adjustment value 531 to the error weighting system 540 for use in generating the weights 541. Since the cost function value 521 corresponds to an accumulation of the coupling capacitance errors, by setting weights 541 for each of the coupling capacitance errors, the error weighting system 540 can identify which coupling capacitance errors can be adjusted. For example, when the error weighting system 540 determines a first coupling capacitance has an error that should be reduced, the error weighting system 540 can provide it a high weight 541. The higher the weight 541 given to a coupling capacitance error, the more that coupling capacitance error will contribute to the cost function value 521 and the greater the impact an adjustment to the error via scaling would impact the cost function value 521. Conversely, when the error weighting system 540 determines a second coupling capacitance has an error that should not be significantly adjusted, the error weighting system 540 can provide it a low weight 541. The lower the weight 541 given to a coupling capacitance error, the less that coupling capacitance error will contribute to the cost function value 521 and the lower the impact an adjustment to the error via scaling would impact the cost function value 521.

The alignment system 530 also can generate the selection signal 534, which can control the selection circuitry 504 to output the training data 501, the test data 502, or the validation data 503. In some embodiments, the alignment system 530 can initially generate a selection signal 534 that directs the selection circuitry 504 to output the training data 501. After the alignment system 530 has determined the errors associated with the training data 501 have fallen below the threshold level, for example, set scaling coefficients 511 for the cost function system 520, the alignment system 530 can generate a selection signal 534 that directs the selection circuitry 504 to output the test data 502. After the alignment system 530 has determined the errors associated with the test data 502 have fallen below the threshold level, the alignment system 530 can generate a selection signal 534 that directs the selection circuitry 504 to output the validation data 503, which can be utilized by the machine learning-based scaling system 500 to ensure the values of the scaling coefficients determined via the training data 501 and test data 502 would configure the parasitic extraction tool for use on other physical design layouts.

Figure 7A:
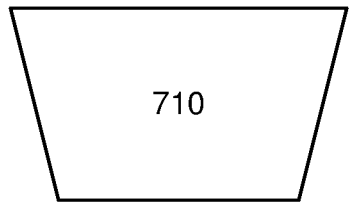
FIGS. 7A-7C illustrate example representations of a conductor cross-section in a physical layout design by a parasitic extraction tool according to various examples.
Figure 7B:
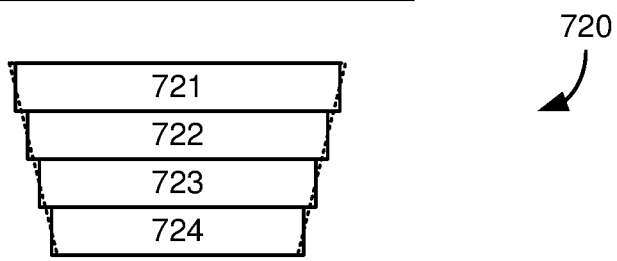
Figure 7C:
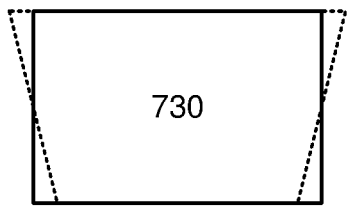

FIGS. 7A-7C illustrate example representations of a conductor cross-section in a physical layout design by a parasitic extraction tool according to various examples. Referring to FIGS. 7A-7C, a cross-section of a conductor 710 in a physical design layout is shown in FIG. 7A. Due to semiconductor fabrication processes, the conductor 710 has a trapezoidal shape, with the bottom width shorter than a top width, or vice versa. A parasitic extraction tool can generate a representation 720 of the conductor 710 for use in parasitic extraction that includes multiple stacked components 721-724. Since the representation 720 for use in parasitic extraction differs from the conductor 710, machine learning-based scaling in the parasitic extraction tool can utilize scaling coefficients on parasitic coupling capacitances generated from the stacked components 721-724 to ensure parasitic extraction of the representation 720 provides an accurate parasitic netlist of the conductor 710. The machine learning-based scaling in the parasitic extraction tool can correct bias or unintended error introduced the parasitic extraction process A simplified representation 730 of the conductor 710 for use in parasitic extraction is shown in FIG. 7C. The simplified representation 730 differs from the conductor 710 more significantly than the representation 720 of the conductor 710, but the machine learning-based scaling in the parasitic extraction tool also can utilize scaling coefficients on parasitic coupling capacitances generated from representation 730 to ensure parasitic extraction of the representation 730 provides an accurate parasitic netlist of the conductor 710. Since the simplified representation 730 of the conductor 710 can allow the parasitic extraction tool to perform parasitic extraction more quickly than the representation 720 of the conductor 710, the implementation machine learning-based scaling in the parasitic extraction tool can improve the overall throughput of the parasitic extraction tool. In some embodiments, the test layout models generated for a foundry certification test also may be generated more similarly to the simplified representation, which can reduce the time rendering accurate test layout models for the foundry certification test.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   generating, by a computing system implementing a parasitic extraction tool, parasitic netlists from tests cases including test layout models of integrated circuit structures by converting the test layout models into electrical representations having groups of parasitic models, wherein the test cases include reference netlists corresponding to intended parasitic netlists for the test layout models; and
   determining, by the computing system, values for scaling coefficients that, when utilized by the parasitic extraction tool to generate the parasitic netlists, allow differences between the parasitic netlists and the reference netlists to fall below threshold levels, wherein the determination of the scaling coefficients is performed by iteratively adjusting the values of the scaling coefficients based on differences between the reference netlists and the parasitic netlists generated with the scaling coefficients having the adjusted values.

2. The method of claim 1, further comprising generating, by the computing system, the scaling coefficients based, at least in part, on geometric information in the test layout models of the integrated circuit structures.

3. The method of claim 1, wherein determining the values for the scaling coefficients further comprises iteratively generating the parasitic netlists with the scaling coefficients having the adjusted values.

4. The method of claim 3, wherein iteratively generating the parasitic netlists with the scaling coefficients further comprises multiplying coupling capacitances in the parasitic netlists with the scaling coefficients.

5. The method of claim 1, wherein iteratively adjusting the values of the scaling coefficients further comprises:
   comparing the parasitic netlists generated with the scaling coefficients having the adjusted values and the reference netlists to determine the differences;
   setting weights for each of the differences; and
   altering the scaling coefficients based, at least in part, on the weights for each of the differences.

6. The method of claim 1, further comprising utilizing, by the computing system, the scaling coefficients to configure the parasitic extraction tool to generate the parasitic netlists that pass the test cases.

7. The method of claim 1, wherein the scaling coefficients corresponding to a measure of differences between an operation of the parasitic extraction tool that generated the parasitic netlists and a different parasitic extraction tool that generated the reference netlists, and further comprising automatically detecting, by the computing system, systemic biases between the parasitic extraction tool and the different parasitic extraction tool based on the scaling coefficients.

8. A system comprising:
   a memory device configured to store machine-readable instructions; and
   a computing system including one or more processing devices, in response to executing the machine-readable instructions, configured to:
      implement a parasitic extraction tool to generate parasitic netlists from tests cases including test layout models of integrated circuit structures by converting the test layout models into electrical representations having groups of parasitic models, wherein the test cases include reference netlists corresponding to intended parasitic netlists for the test layout models; and
      determine values for scaling coefficients that, when utilized by the parasitic extraction tool to generate the parasitic netlists, allow differences between the parasitic netlists and the reference netlists to fall below threshold levels, wherein the determination of the scaling coefficients is performed by iteratively adjusting the values of the scaling coefficients based on differences between the reference netlists and the parasitic netlists generated with the scaling coefficients having the adjusted values.

9. The system of claim 8, wherein the one or more processing devices, in response to executing the machine-readable instructions, are configured to generate initial values for the scaling coefficients based, at least in part, on geometric information in the test layout models of the integrated circuit structures.

10. The system of claim 8, wherein the one or more processing devices, in response to executing the machine-readable instructions, are configured to determine the values for the scaling coefficients by iteratively generating the parasitic netlists with the scaling coefficients having the adjusted values.

11. The system of claim 10, wherein the one or more processing devices, in response to executing the machine-readable instructions, are configured to iteratively generate the parasitic netlists with the scaling coefficients by multiplying coupling capacitances in the parasitic netlists with the scaling coefficients.

12. The system of claim 8, wherein iteratively adjusting the values of the scaling coefficients further comprises:
   comparing the parasitic netlists generated with the scaling coefficients having the adjusted values and the reference netlists to determine the differences;
   setting weights for each of the differences; and altering the scaling coefficients based, at least in part, on the weights for each of the differences.

13. The system of claim 8, wherein the one or more processing devices, in response to executing the machine-readable instructions, are configured to utilize the scaling coefficients to configure the parasitic extraction tool to generate the parasitic netlists that pass the test cases.

14. An apparatus including a memory device storing instructions configured to cause one or more processing devices to perform operations comprising:
  implementing a parasitic extraction tool to generate parasitic netlists from tests cases including test layout models of integrated circuit structures by converting the test layout models into electrical representations having groups of parasitic models, wherein the test cases include reference netlists corresponding to intended parasitic netlists for the test layout models; and
  determining values for scaling coefficients that, when utilized by the parasitic extraction tool to generate the parasitic netlists, allow differences between the parasitic netlists and the reference netlists to fall below threshold levels, wherein the determination of the scaling coefficients is performed by iteratively adjusting the values of the scaling coefficients based on differences between the reference netlists and the parasitic netlists generated with the scaling coefficients having the adjusted values.

15. The apparatus of claim 14, wherein the instructions are configured to cause one or more processing devices to perform operations further comprising generating initial values for the scaling coefficients based, at least in part, on geometric information in the test layout models of the integrated circuit structures.

16. The apparatus of claim 14, wherein determining the values for the scaling coefficients further comprises iteratively generating the parasitic netlists with the scaling coefficients having the adjusted values.

17. The apparatus of claim 16, wherein iteratively generating the parasitic netlists with the scaling coefficients further comprises multiplying coupling capacitances in the parasitic netlists with the scaling coefficients.

18. The apparatus of claim 14, wherein iteratively adjusting the values of the scaling coefficients further comprises:
  comparing the parasitic netlists generated with the scaling coefficients having the adjusted values and the reference netlists to determine the differences;
  setting weights for each of the differences; and
  altering the scaling coefficients based, at least in part, on the weights for each of the differences.

19. The apparatus of claim 14, wherein the instructions are configured to cause one or more processing devices to perform operations further comprising utilizing the scaling coefficients to configure the parasitic extraction tool to generate the parasitic netlists that pass the test cases.

20. The apparatus of claim 14, wherein the scaling coefficients corresponding to a measure of differences between an operation of the parasitic extraction tool that generated the parasitic netlists and a different parasitic extraction tool that generated the reference netlists, and further comprising automatically detecting, by the computing system, systemic biases between the parasitic extraction tool and the different parasitic extraction tool based on the scaling coefficients.

* * * * *